United States Patent [19]

Schutten et al.

[11] Patent Number: 4,612,465
[45] Date of Patent: Sep. 16, 1986

[54] LATERAL BIDIRECTIONAL NOTCH FET WITH GATES AT NON-COMMON POTENTIALS

[75] Inventors: Herman P. Schutten, Whitefish Bay; Robert W. Lade, Milwaukee; James A. Benjamin, Waukesha, all of Wis.

[73] Assignee: Eaton Corporation, Cleveland, Ohio

[21] Appl. No.: 734,031

[22] Filed: May 13, 1985

Related U.S. Application Data

[63] Continuation-in-part of Ser. No. 390,473, Jun. 21, 1982, Pat. No. 4,546,367.

[51] Int. Cl.⁴ .......................................... H03K 17/687
[52] U.S. Cl. ................... 307/584; 357/23.4; 357/23.14; 357/43; 357/55; 357/59; 357/39; 357/86; 307/304
[58] Field of Search .................. 357/23.4, 23.14, 39, 357/55, 59, 86, 43; 307/571, 577, 584, 304

[56] References Cited

U.S. PATENT DOCUMENTS 4,199,774  4/1980  Plummer ........................... 357/23.4
4,414,560 11/1983  Lidow ............................... 357/23.4

OTHER PUBLICATIONS

J. Tihanyi, "Functional Integration of Power MOS and Bipolar Devices", 1980, I.E.D.M. Tech. Digest, CH1616-2, pp. 75-78.

*Primary Examiner*—Joseph E. Clawson, Jr.
*Attorney, Agent, or Firm*—Andrus, Sceales, Starke & Sawall

[57] ABSTRACT

Lateral FET structure is disclosed for bidirectional power switching, including AC application. A notch extends downwardly from a top major surface to separate left and right source regions and left and right channel regions, and direct the drift region current path between the channels around the bottom of the notch. Split gate electrodes in the notch proximate the channels control bidirectional conduction, and are at non-common potentials in the OFF state to increase breakdown voltage. Self-shielding of the gates is also disclosed to further increase OFF state breakdown voltage.

3 Claims, 22 Drawing Figures

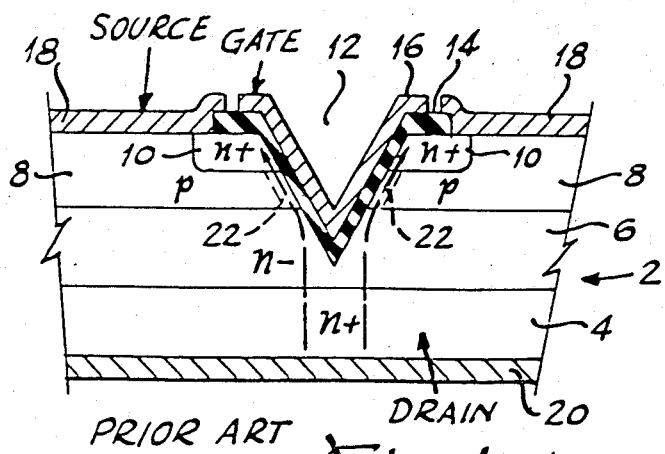
Fig. 1 VMOS FET — PRIOR ART
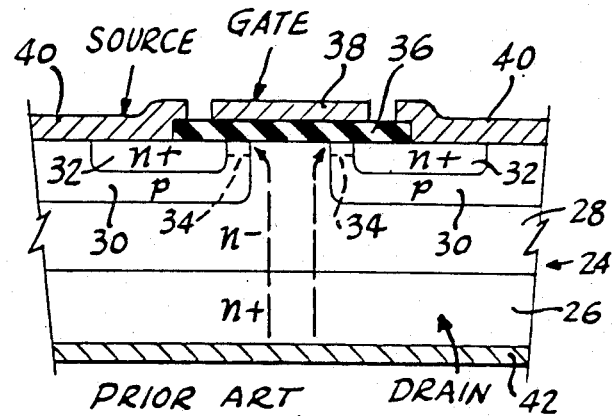
Fig. 2 DMOS FET — PRIOR ART
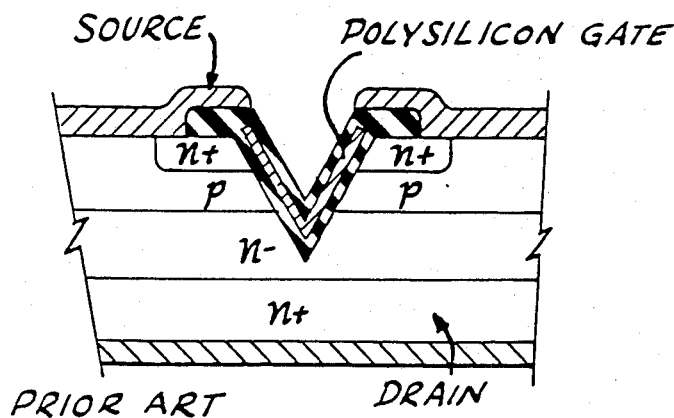
Fig. 3 VMOS WITH POLY-SI GATE — PRIOR ART

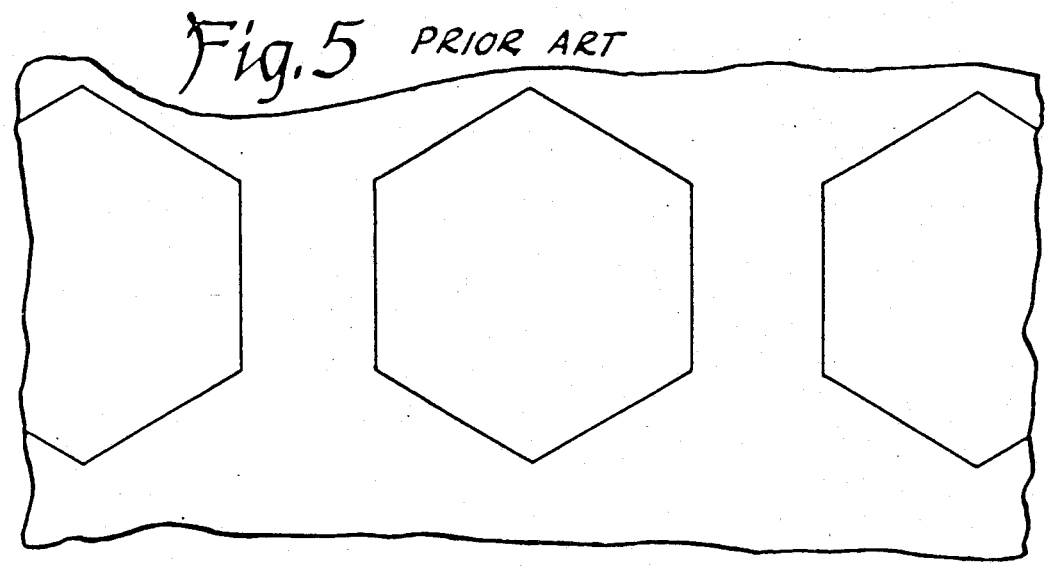
Fig. 5 PRIOR ART
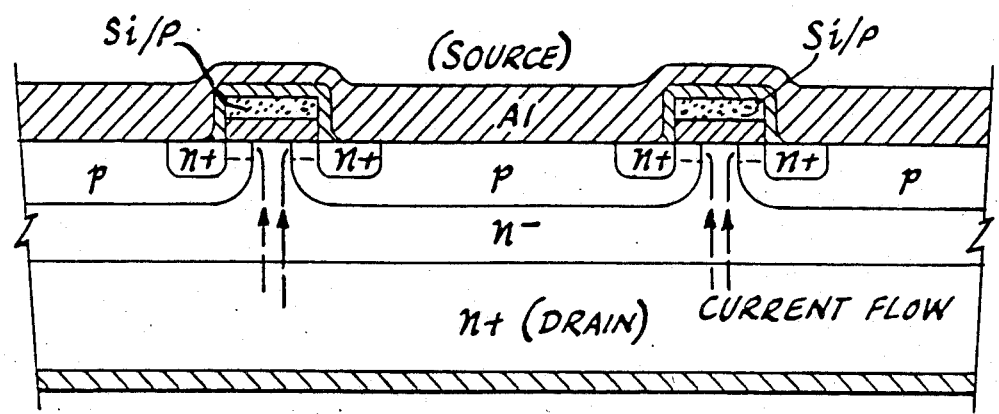
Fig. 4 PRIOR ART DMOS WITH POLY-SI GATE (HEX FET)
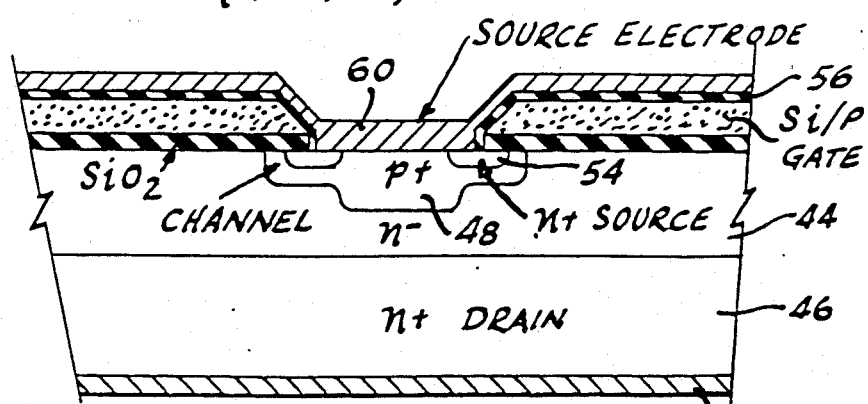
Fig. 6 PRIOR ART SIPMOS FET

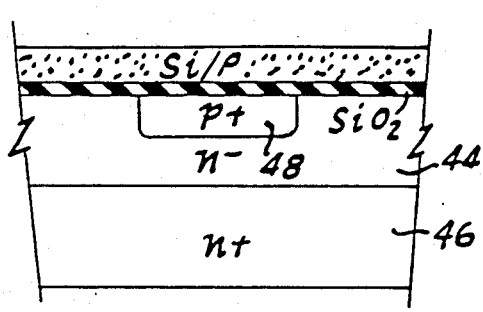
Fig. 7 PRIOR ART
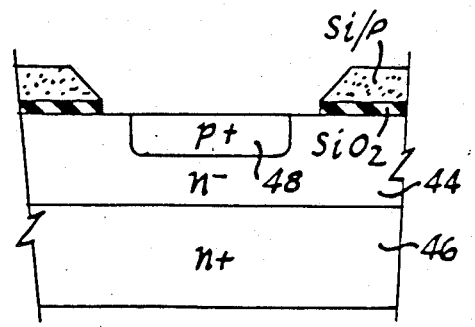
Fig. 8 PRIOR ART
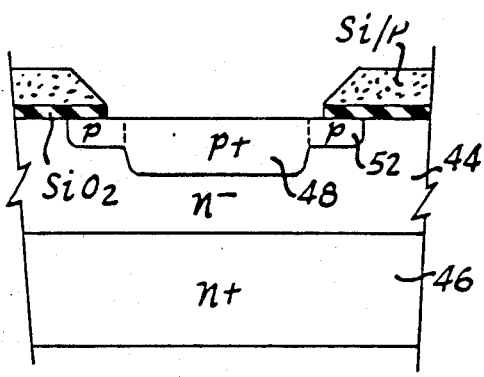
Fig. 9 PRIOR ART
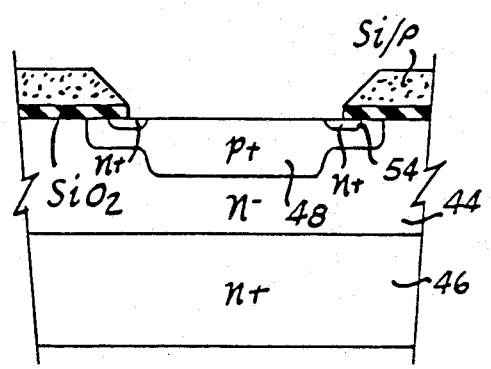
Fig. 10 PRIOR ART
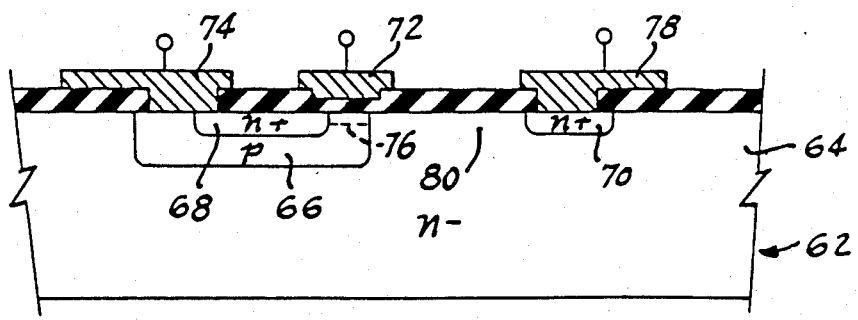
Fig. 11 PRIOR ART LATERAL MOSFET

LATERAL BIDIRECTIONAL NOTCH FET WITH GATES AT NON-COMMON POTENTIALS

This application is a Continuation-In-Part Application of co-pending application for U.S. Pat. Ser. No. 06/390,473, filed June 21, 1982, now U.S. Pat. No. 4,546,367.

TECHNICAL FIELD

The invention relates to power switching semiconductors, and more particularly to power MOSFETs (Metal Oxide Semiconductor Field Effect Transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e. resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $R_{on} = kV_B^{2.6}$ ohm-cm$^2$ where $R_{on}$ where $R_{on}$ is the ON state resistance, k is a constant $(3.7 \times 10^{-9})$ and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ed-26, pages 243-244, 1979.

SUMMARY

The present invention provides lateral power FET structure which is bidirectional, i.e. current can flow in either direction when the device is in the ON state, whereby to afford AC application.

A notch gate structure is provided to afford increased OFF state voltage blocking capability, including non-floating gate implementations.

A notch extends downwardly from a top major surface to separate right and left source regions and right and left channel regions, and direct the drift region current path between the channels around the bottom of the notch. Gate electrode means are provided in the notch proximate the channels for controlling bidirectional conduction.

Blocking voltage is increased without increasing the lateral dimension of the drift region. In preferred form, the notch has a lower insulative portion extending downwardly into the drift region to a depth substantially below the gate electrode means in the notch.

In a desirable aspect, the structure of the invention involves easy processing steps. In another aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

FIG. 1 is a schematic cross-sectional view of a VMOS FET.

FIG. 2 is a schematic cross-sectional view of a DMOS FET.

FIG. 3 is a schematic cross-sectional view of a VMOS FET with a polysilicon gate.

FIG. 4 is a schematic cross-sectional view of a DMOS FET with a polysilicon gate (HEXFET).

FIG. 5 shows a top view of the structure of FIG. 4, illustrating the HEX outline.

FIG. 6 is a schematic cross-sectional view of a SIPMOS FET.

FIGS. 7 through 10 schematically illustrate the process steps yielding the structure of FIG. 6.

FIG. 11 is a schematic cross-sectional view of a lateral MOSFET.

PRESENT INVENTION

Figure 12:
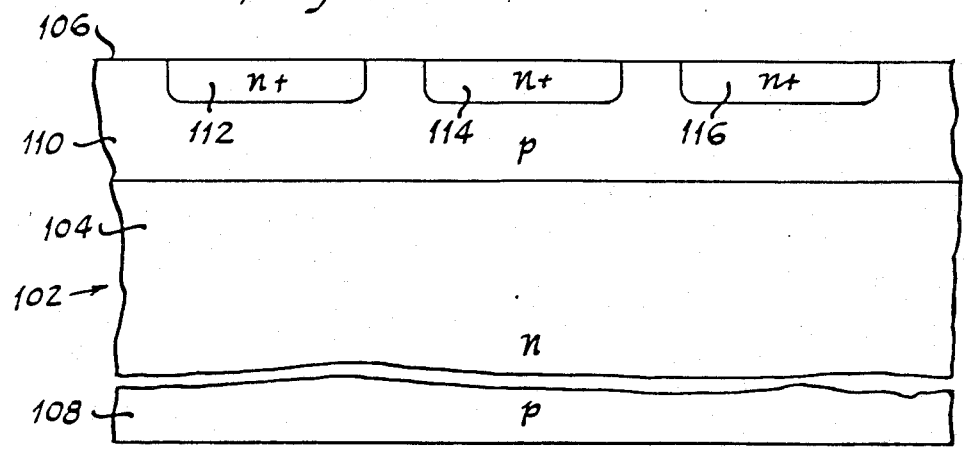

FIG. 12 is a schematic sectional view illustrating the initial process steps in providing FET structure constructed in accordance with the invention.

Figure 13:
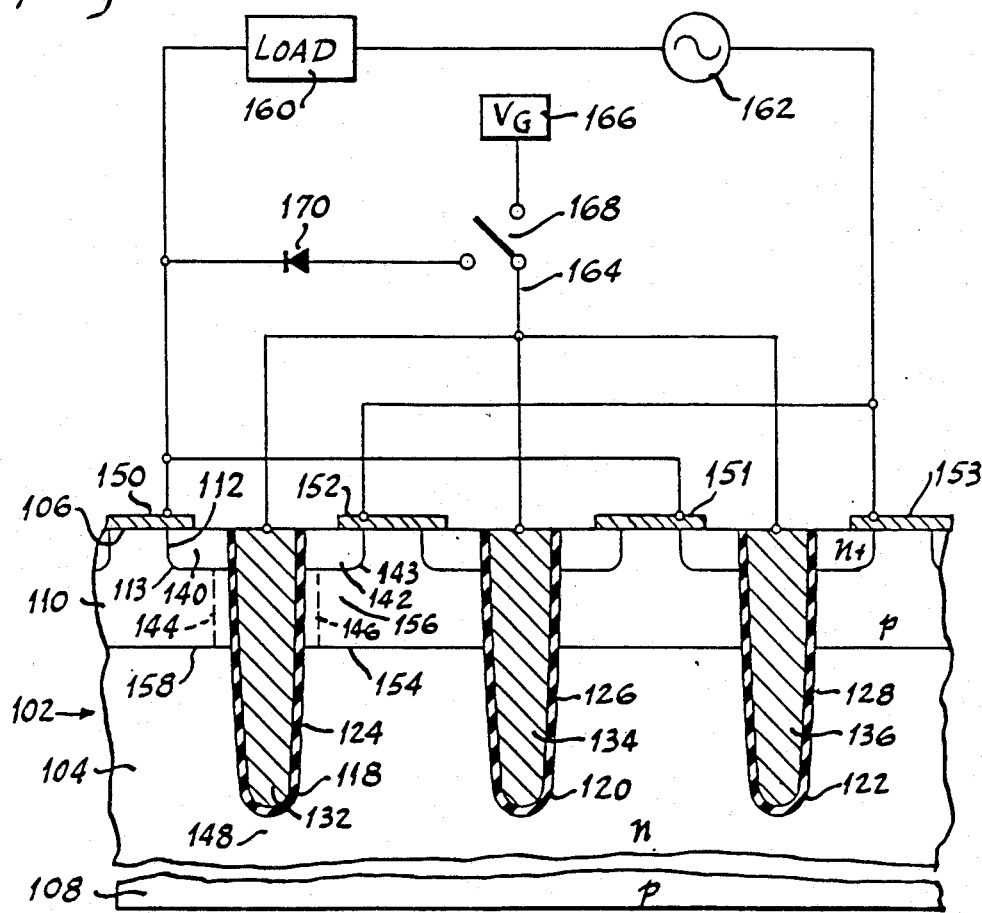
Figure 14:
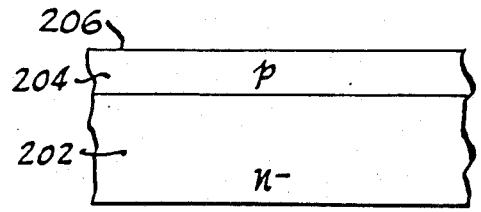
Figure 15:
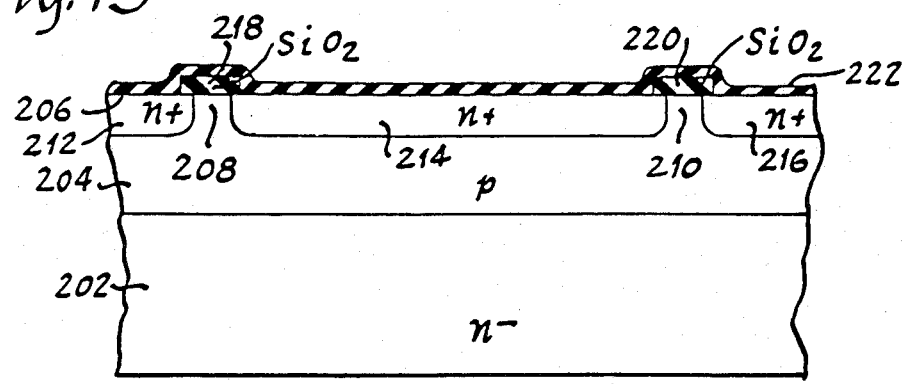
Figure 16:
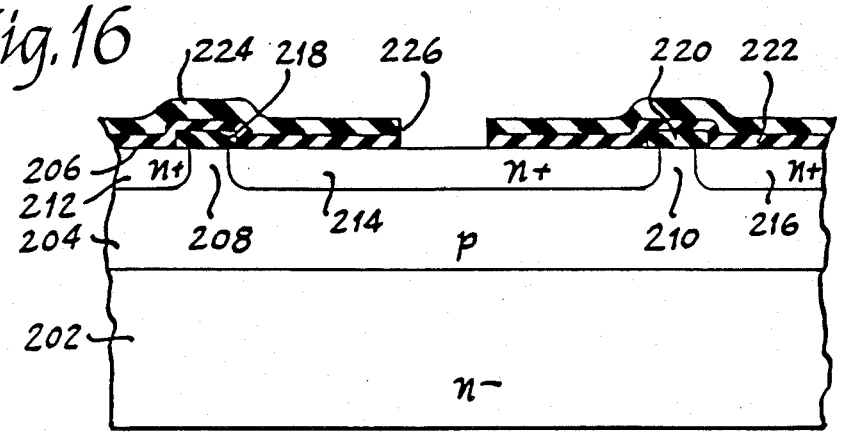
Figure 17:
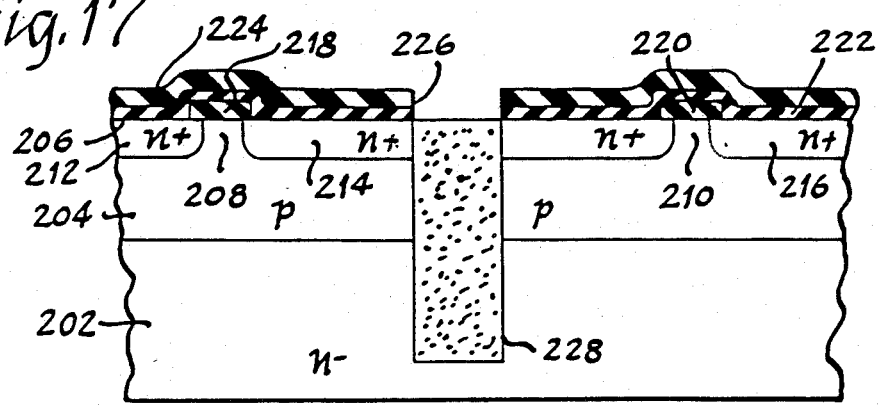

FIG. 13 is a schematic sectional view of completed FET structure constructed in accordance with the invention.

FIGS. 14 through 21 show the preferred processing and structure of the invention.

Figure 22:
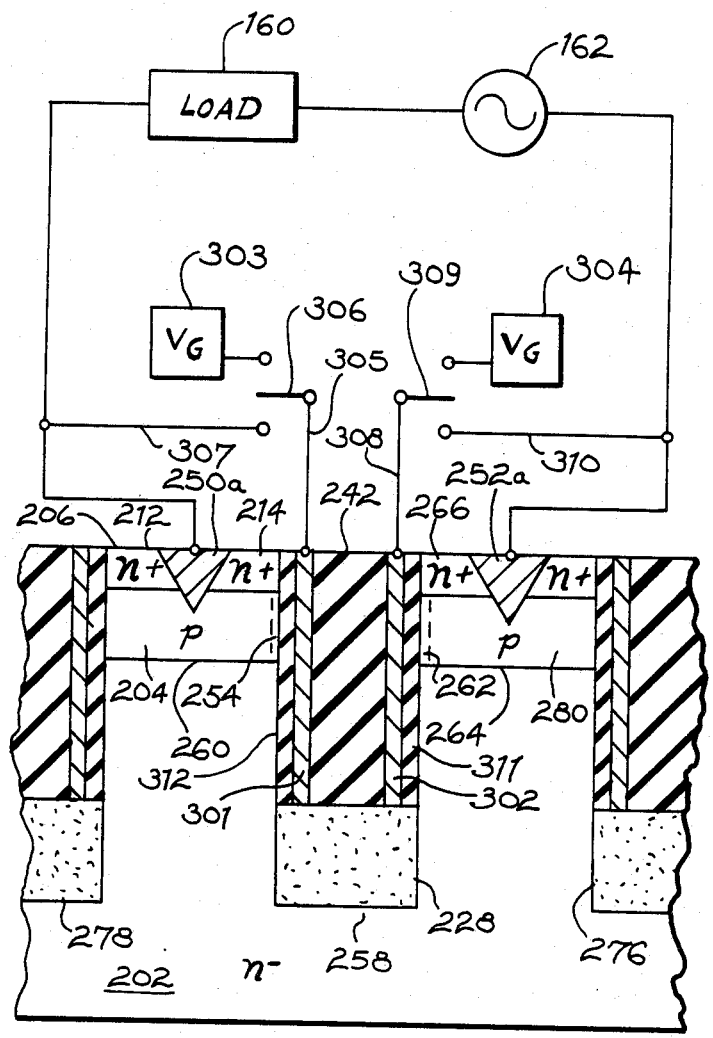

FIG. 22 shows the split gate structure of the invention.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

A cross-sectional view of a typical non-planar vertical device is illustrated in FIG. 1, showing a VMOS structure 2. The starting material is an n+ silicon wafer 4 with an n− epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs" C. Hu, IEEE Electron Device Conference, paper CH1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907-914.

An alternative configuration is the DMOS (double diffused metal oxide semiconductor) FET 24, FIG. 2. N+ starting material 26 has an n− epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 80% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$ such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Another vertical planar unit is the SIPMOS structure shown in FIG. 6. An n− epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrogen chloride. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

As with the previously mentioned vertical MOSFETs, the lateral MOSFET 62 of FIG. 11 is unidirectional.

Device 62 is subject to the above noted tradeoff between lateral length of the drift region 80 (i.e. the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabilities of n region 64 and p region 66. Thus a new geometry and perhaps technology would be required.

Though not limited thereto, the present invention evolved from efforts to provide bidirectionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

FIGS. 12 and 13 schematically show lateral bidirectional power FET structure constructed in accordance with the invention. FET structure 102 includes a substrate 104 of one conductivity type having a top major surface 106. In preferred form, substrate 104 is an n− epitaxial layer grown on a base layer of semiconductor material such as p layer 108.

A p layer 110 is diffused into the substrate from top major surface 106 to a predetermined depth forming a first top layer. A second top layer 112 is formed in first top layer 110 by diffusion from top major surface 106 to a given depth. A plurality of laterally spaced second top layers 112, 114, 116 and so on, are provided by n+ regions.

Referring to FIG. 13, a plurality of notches 118, 120, 122 and so on, are formed in the substrate from top major surface 106 through respective n+ regions 112, 114, 116 and so on and through top layer 110 into substrate region 104. These notches may be anisotropically etched, as known in the art: C. Hu, "A Parametric Study of Power MOSFETs", *IEEE Electron Device Conference*, paper CH 1461-3/79, 0000–0385; *IEEE Transactions Electron Devices*, Volume ed-25, #10, October 1978; and Ammar and Rogers, "UMOS Transistors on Silicon", *Transactions IEEE*, ed-27, pages 907–914, May 1980. Alternatively, the notches may be formed by a porous silicon region in accordance with the known anodization technique of passing a fixed current through the localized region in the presence of concentrated hydrogen floride to create a structural change in the silicon which remains single crystalline with the substrate but becomes porous. After the anisotropic etch or the anodization, the substrate is subjected to an oxidizing atmosphere forming oxide layers 124, 126, 128 and so on. The remainder of the notch is preferably filled with tungsten disilicide, which is a conductor and provides the gate electrode as shown at 132, 134, 136 and so on.

Notch 118 extends from top major surface 106 downwardly through second top layer 112 and first top layer 110 into substrate region 104. Notch 118 separates the second top layer 112 into first and second source regions 140 and 142 and extends therebetween. Notch 118 separates the first top layer 110 into first and second channel regions 144 and 146 and extends therebetween. The substrate region 104 around the notch forms a drift region 148 of the substrate.

Main electrode metallization 150 is deposited on top major surface 106 to ohmically contact source region 140 and the second top layer 110 common to channel region 144. Another main electrode metallization 152 is deposited on top major surface 106 to ohmically contact source region 142 and the first top layer 110.

Upon application of a positive voltage to gate electrode 132 with respect to source region 140, electrons in p region 110 are attracted to channel region 144 to invert the conductivity type therein to n type. If main electrode 152 is positive with respect to main electrode 150, current may then flow from p layer 110 momentarily across a forward biased pn junction 154 into drift region 148, then through channel 144 to source region 140 and electrode 150. As soon as current starts to flow through the FET, the voltage across main electrodes 150 and 152 drops, which in turn reduces the potential in various regions of the FET, including portion 156 of p layer 110 adjacent the other FET channel 146. Portion 156 thus becomes negative relative to gate 132, whereby positive gate 132 attracts electrons into channel region 146 to invert the conductivity type thereof to n type, and hence render channel 146 conductive. Forward biased pn junction 154 thus conducts only momentarily until the second channel 146 turns on.

The main current path through FET 102 is from main electrode 152 through source region 142, downwardly through vertical channel region 146 along the right side of notch 118, then further downwardly into drift region 148 along the right side of the notch, then around the bottom of notch 118, then upwardly along the left side of notch 118 in drift region 148 of substrate 104, then upwardly through vertical channel region 144 along the left side of notch 118, then through source region 140 to main electrode 150.

The structure is bilateral, and thus current may also flow from main electrode 150 to main electrode 152 when gate 132 is positive with respect to source 142. Electrons in p layer 110 are attracted into channel region 146 by gate 132 to thus invert channel region 146 to n type and hence allow electron flow from n+ source region 142 through channel 146 into drift region 148 in substrate 104. If main electrode 150 is positive with respect to main electrode 152, current then flows from p layer 110 momentarily across forward biased pn junction 158 until channel 144 turns on. The main current path is from main electrode 150, through source 140, through channel 144, through drift region 148, through channel 146, through source 142 to main electrode 152. Main electrode 152 thus serves as an electron current source when a negative voltage is applied thereto relative to the voltage on main electrode 150, and serves as an anode when a positive voltage is applied thereto relative to the voltage on main electrode 150.

The application of electrical gate potential to gate electrode 132 enables the latter to produce electric fields of sufficient intensity to invert the conductivity type in the first and second channel regions 144 and 146. Upon application of voltage of either polarity to the first and second source regions 140 and 142, electric current can flow in a respective corresponding direction between them, under control of the electrical gate potential of the gate electrode means 132. The current flow between spaced apart regions 140 and 142 is controllable by controlling the electric fields in channel regions 144 and 146, which in turn are controllable by controlling the electric potential on the gate electrode means 132.

In the absence of gate potential on gate electrode 132, channel regions 144 and 146 are p type, and the device is in a blocking OFF state. Current from main electrode 150 to main electrode 152 is blocked by junction 154. Current flow in the other direction from main electrode 152 to main electrode 150 is blocked by junction 158.

Bidirectional FET 102 may be used to control AC power. FIG. 13 schematically shows a load 160 and a source of AC power 162 connected across main electrodes 150 and 152. Gate electrode 132 is connected by a gate terminal 164 to a source of gate potential 166 through switch means 168. In the ON state of FET 102, switch 168 is in an upward position such that a given polarity gate potential is applied to gate electrode 132 from source 166. When main electrode 152 is positive with respect to main electrode 150, as driven by AC source 162, gate electrode 132 is positive with respect to source region 140 and main electrode 150, connected to p layer 110. Hence, channel 144 is inverted to n type and conduction occurs, i.e., current flows from positive main electrode 152, through source region 142, through channel 146, through drift region 148 around the bottom of notch 118 in substrate 104, through channel 144, through source 140 to negative main electrode 150 and through load 160.

In the other half cycle of the AC source 162, main electrode 150 is positive with respect to main electrode 152, and gate electrode 132 is positive with respect to source region 142 and p layer 110 connected to negative main electrode 152. Conduction is thus enabled through channel 146, and current flows from positive main electrode 150 through source 140, through channel 144, through drift region 148 around the bottom of notch 118 in substrate 104, through channel 146, to source 142 and main electrode 152.

In preferred form, gate terminal 164 is referenced to the same potential level as one of the main electrodes in the OFF state of FET 102. In the leftward position of switch 168, gate terminal 164 is connected through reverse blocking diode 170 to main electrode 150.

As seen in FIG. 13, a plurality of FETs are afforded in the integrated structure. N+ regions or top layers 114 and 116, FIG. 12, are likewise split and separated into laterally spaced first and second source regions along top major surface 106 by respective notches 120 and 122. Main electrode metallizations are provided comparably to that described, and connected in series in the AC load line, or in parallel as shown in FIG. 13. Gate electrodes 134 and 136 are connected in parallel with gate electrode 132 to gate terminal 164. Main electrode 152 provides the source electrode for the FET to the left around notch 118, and also provides the source electrode for the FET to the right around notch 120. Main electrode 151 provides the drain electrode for the FET around notch 120, and also provides the drain electrode for the FET around notch 122. In the other half cycle of AC source 162, the roles of electrodes 152 and 151 are reversed, i.e. electrode 152 is the drain for its left and right FETs around respective notches 118 and 120, and electrode 151 is the source for its left and right FETs around respective notches 120 and 122. Alternate electrodes 150, 151 and so on are thus connected to one side of the AC source, and the other alternate electrodes 152, 153 and so on are connected to the other side of the AC source.

In one embodiment, the depth of the p layer 110 below top major surface 106 is about 3 microns, and the depth of the n+ layers 112, 114, and 116 is about 1 micron. The depth of notches 118, 120, 122 and so on below top major surface 106 is about 15 microns, which affords a depletion region path length of 30 microns.

There is thus shown a lateral bidirectional notched power FET, including: a first source region 140 of one conductivity type; a first channel region 144 of opposite conductivity type forming a junction 113 with first source region 112; a drift region 148 of the one conductivity type forming another junction 158 with the first channel region 144; a second channel region 146 of the opposite conductivity type forming a junction 154 with drift region 148; a second source region 142 of the one conductivity type forming a junction 143 with second channel region 146; a notch 118 extending between and separating the first and second source regions 140 and 142 and the first and second channel regions 144 and 146, and extending into drift region 148 in substrate 104; insulated gate means 132 and 124 in notch 118 proximate the first and second channels 144 and 146 and adapted for application of electrical potential for producing electric fields of sufficient intensity to invert the conductivity type in the first and second channel regions 144 and 146; whereby upon application of voltage of either polarity to the first and second source regions 140 and 142, electric current can flow in a respective corresponding direction between them, under control of the electrical potential of the gate means, the conductive current path through drift region 148 traversing along one side of notch 118 then around the end thereof and then along the other side of notch 118.

FIGS. 14 through 21 show the preferred processing and structure of the invention. Starting with a lightly doped n− substrate 202 in FIG. 14, for example having a donor density of about $6 \times 10^{14}$ donor atoms per cubic centimeter, p type epitaxial layer 204 is provided with boron at a density of about $1 \times 10^{17}$ donor atoms per cubic centimeter, and having a depth of about 3 microns. A layer of silicon dioxide $SiO_2$ is then grown on the top surface 206, followed by masking and exposing to define p areas 208 and 210, FIG. 15, followed by arsenic deposition and diffusion to provide n+ regions 212, 214, 216, and so on, to a depth of about 1 micron and having a surface concentration of $1 \times 10^{21}$. Regions 218 and 220 are the silicon dioxide areas remaining after the masking and exposure etching. During the arsenic diffusion, another silicon dioxide layer 222 forms over the top surface.

Next, a silicon nitrite $Si_4N_3$ layer 224 is deposited to a thickness of about 4 microns, to provide a high quality insulating material and a mask definition material. The silicon nitrite layer 224 is plasma etched down to top major surface 206, forming hole 226, FIG. 16, or the etch is performed down to level 230, FIG. 18.

A porous silicon region 228 is then formed by anodization in the presence of hydrogen floride as above. Contacts are placed on the top and bottom surfaces, and since silicon nitrite layer 224 is an insulator, current will only pass through the notch hole 226 to thus provide selective anodization through vertical region 228. A structural change is created in the silicon which remains single crystalline with substrate 202 but becomes porous. The depth of porous silicon region 228 below top major surface 206 is about 14 or 15 microns.

Figure 18:
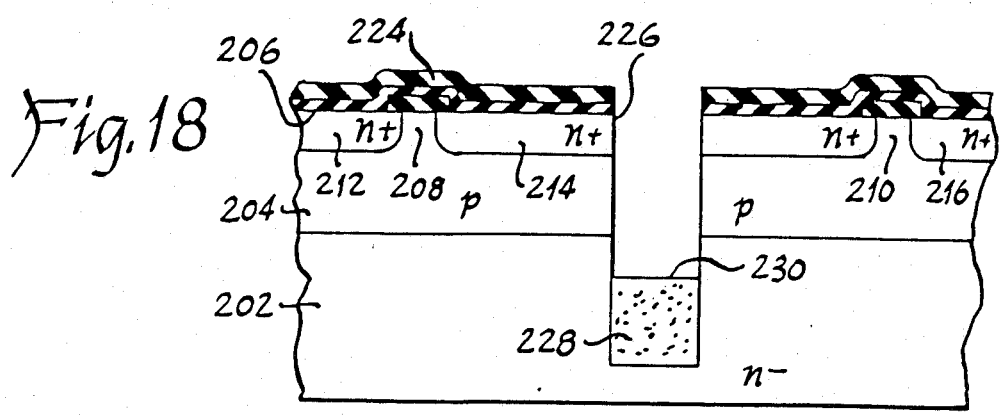
Figure 19:
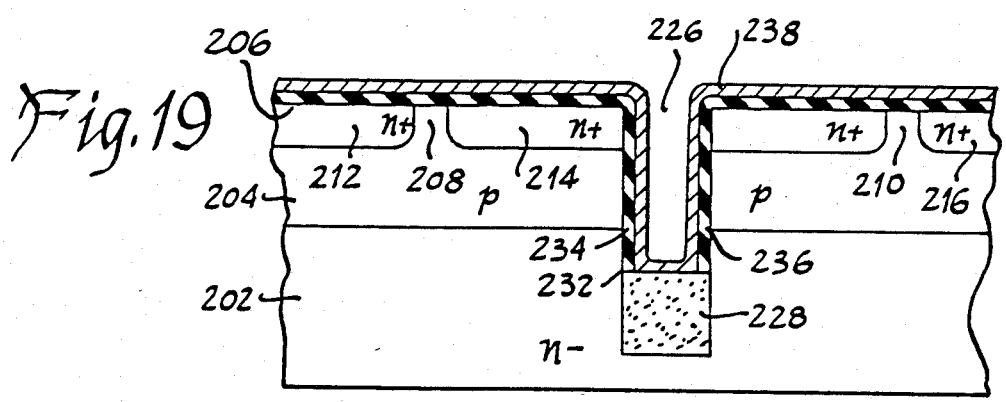
Figure 20:
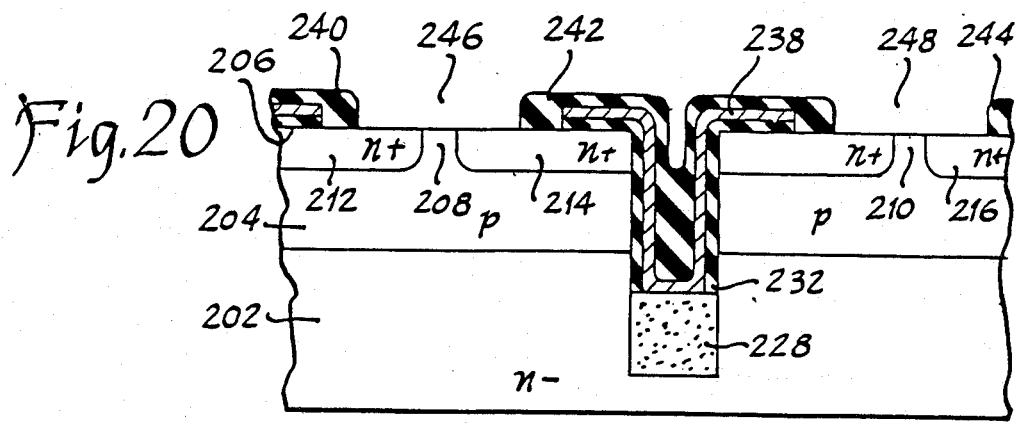

The notch is then etched down to level 230, FIG. 18, about 4 microns below top major surface 206. The silicon nitrate layer 224 and oxide layers are removed by etching and the substrate is subjected to an oxidizing atmosphere such that the oxygen enters the pores in porous region 228 and rapidly oxidizes region 228, whereby region 228 is still single crystalline with substrate 202 but substantially nonconductive. After the oxidation, a silicon dioxide layer 232, FIG. 19, also remains. The porous silicon region 228 oxidizes much faster than the growth of silicon dioxide layer 232, whereby to afford process control enabling gate oxide segments 234 and 236 along the vertical walls of the notch hole 226, FIG. 19.

Titanium disilicide $TiSi_2$ layer 238 is then deposited over the top surface by a sputtering process. Alternatives are tungsten disilicide and tantalum disilicide. Sputtering is preferred in order to prevent shadowing, i.e. gaps below corners. Layer 238 is then masked and etched, followed by low temperature silicon dioxide chemical vapor deposition, FIG. 20, providing insulating layers 240, 242, 244, and so on, and open areas 246, 248, and so on. Aluminum metallization is then sputtered or deposited in the open areas 246 and 248, resulting in main electrodes 250 and 252, FIG. 21.

Figure 21:
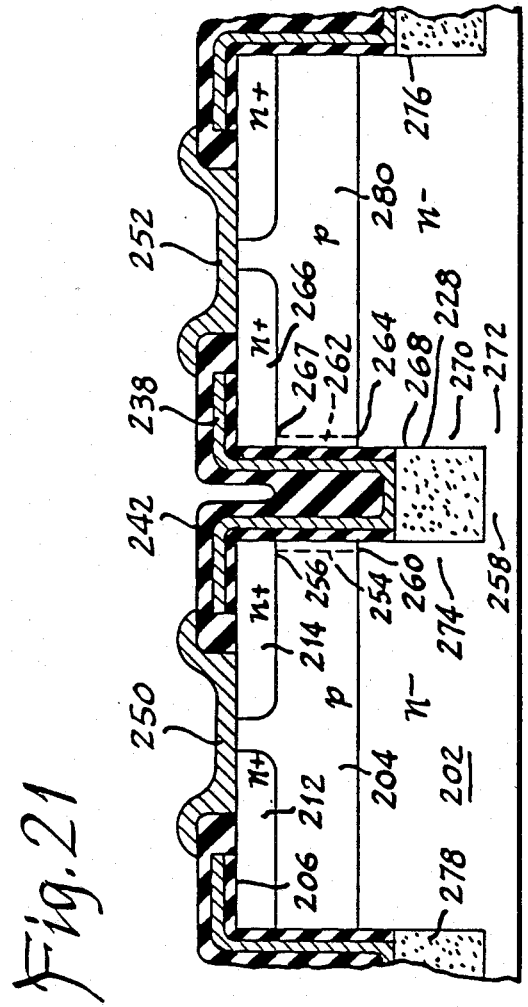

FIG. 21 shows the preferred structure of the invention. A bidirectional lateral power FET is provided by: a first source region 214 of one conductivity type; a first channel regions 254 of opposite conductivity type forming a junction 256 with first source region 214; a drift region 258 of the one conductivity type forming another junction 260 with the first channel region 254; a second channel region 262 forming a junction 264 with drift region 258; a second source region 266 of the one conductivity type forming a junction 267 with the second channel region 262; a notch 268 extending between and separating the first and second source regions 214 and 266 and the first and second channel regions 254 and 262, and extending into drift region 258; and insulated gate means 238 in notch 268 proximate the first and second channels 254 and 262 and adapted for application of electrical potential for producing electric fields of sufficient intensity to invert the conductivity type in the first and second channels 254 and 262. Upon application of voltage of either polarity to the first and second source regions 214 and 266 from respective main electrodes 250 and 252, electric current can flow in a respective corresponding direction between them, under control of the electrical potential of the gate means 238. The conductive current path through the drift region 258 traverses along one side 270 of notch 268 then around the end 272 of the notch and then along the other side 274 of the notch.

Like FIG. 13, the contact structure of FIG. 21 provides a common main electrode for adjacent FETs. If main electrode 252 is positive with respect to main electrode 250, then electrode 252 provides the source contact for the left FET around the bottom of notch 268, and also provides the source contact for the FET to the right thereof around notch 276. Likewise, electrode 250 provides the drain contact for the FET to the right thereof around notch 268, and also provides the drain contact for the FET to the left thereof around notch 278.

Unlike FIG. 13, the gate electrode 238 in Fig. 21 does not extend down too far into drift region 258 within insulator notch region 228. This prevents unwanted inducement of conduction channels in the OFF state, which in turn affords higher OFF state voltage blocking capability. In the OFF state, if the voltage on main electrode 252 is positive with respect to main electrode 250, and if gate electrode 238 is referenced to electrode 250, then as the positive voltage on main electrode 252 rises higher, the potential in substrate 202 likewise rises positively with respect to gate electrode 238 because of the single forward junction drop across pn junction 264. Gate electrode 238 thus becomes more negative relative to drift region 258 in substrate 202, and if the gate electrode extends down within insulative region 228, the gate electrode would attract holes toward the edges of insulative region 228 along the sides of notch 268. If the concentration of carrier holes along sides 270, 272 and 274 of the notch becomes great enough, then conductivity inversion to p type may occur along these sides. This inducement of conduction channels enables conduction from p region 280 through the induced p type conduction channel in drift region 258 around the notch then to p region 204.

The structure of the gate electrode means in FIG. 21 prevents unwanted inducement of conduction channels in the OFF state. The spacing of gate electrode 238 from the edges of the notch, particularly the bottom edge of the notch, substantially diminishes the attractive force on carrier holes toward the edges of notch 268, particularly around the bottom end 272. This enables higher OFF state voltage blocking capability, even in nonfloating gate implementations.

Higher OFF state voltage blocking capability is further afforded by the increased drift region current path length. The current path between the main electrodes extends from each source region downwardly through the channel regions and downwardly and around the bottom 272 of the notch. This increases the drift region current path length and affords higher OFF state voltage blocking capability without increasing the lateral dimension along the top major surface 206, whereby to afford a high density, high voltage bidirectional FET structure.

FIG. 22 shows an alternate embodiment of FIG. 1, and like reference numerals are used where appropriate to facilitate clarity. A split gate electrode structure is provided by first and second separate laterally spaced gate electrode 301 and 302, each of which has its own gating voltage source 303 and 304, and each of which is referenced to a respective main electrode 250a and 252a. Main electrodes 250a and 252a extend down through the source regions into respective channel-containing regions 204 and 280, to provide the same type of shorting as in FIG. 21. Gate electrode 301 is connected to a first gate terminal 305 which in the FET ON state is connected through switch 306 to gating voltage source 303, and in the FET OFF state is connected to terminal 307 to thus be referenced to main electrode 250a. Second gate electrode 302 is connected to a second gate terminal 308 which in the FET ON state is connected through switch 309 to gating voltage source 304, and in the FET OFF state is connected to terminal 310 to thus be referenced to main electrode 252a. Increased OFF state breakdown voltage is provided by the first and second gate electrodes at non-common potentials in the OFF state. In the OFF state, switches 306 and 309 are in the downward position such that gate electrode 301 is connected to the same potential level as main electrode 250a, and gate electrode 302 is connected to the same potential as main electrode 252a.

During the first half cycle of AC source 162 in the OFF state of the FET, voltage rises positively at right main electrode 252a relative to left main electrode 250a. The potential in right p region 280 thus rises positively, and since there is only a single forward biased drop across junction 264 to substrate 202, the potential in substrate 202 likewise rises positively. The potential in substrate area 311 along the right side of notch 228 below right channel 262 thus also rises positively. The left gate electrode 301 is negative since it is tied through terminal 305, switch 306 and terminal 307 to the left main electrode 250a. This relatively negative gate electrode 301 thus establishes an electric field gradient between itself and the relatively positive substrate 202. This relatively negative gate electrode 301 and the electric field gradient causes attraction of carrier holes in substrate 202 toward the edges of notch 228 below gate electrode 301. The potential at region 312 in the substrate is low, but the potential in the substrate increases as one moves downwardly along the left edge of notch 228 farther away from negative gate electrode 301 An electric field gradient is established between the distal edges of the notch, i.e., the potential in substrate drift region portion 311 along the right edge of notch 228 is positive relative to the potential in substrate drift region portion 312 along the left edge of the notch.

As the potential on right main electrode 252a rises higher relative to left main electrode 250a, the noted electric field gradient becomes stronger. More holes in substrate 202 are attracted into region 312 along the right side of the notch below right channel 262 due to the attraction from negative left gate electrode 301 and the electric field gradient created. Holes thus migrate into region 311, causing depletion of majority carrier electrons out of this region. If the concentration of minority carrier holes along region 311 becomes great enough, the conductivity type of this drift region portion along the edge of the notch may become inverted to p type. If a p type channel is formed along region 311, then a conductive p channel may be formed in the drift region around the notch, and the device loses its OFF state voltage blocking capability. That is, current can flow from positive right main electrode 252a through p region 280, through the electric field gradient induced p channel along the edges of the notch, through p region 204 to negative main electrode 250a. The induced conductive channel depletion region extends along the right side of notch 228 then around the bottom of the notch, then along the left side of the notch. This limits the OFF state voltage blocking capability of the device.

The structure in FIG. 22 enhances OFF state voltage blocking capability in a number of ways. The right gate electrode 302 shields the right notch edge drift region portion 311 from the electric field gradient from left gate electrode 301, thus preventing depletion and unwanted inducement of conduction channels in the drift region along the notch during the OFF state of the FET, thus affording higher voltage blocking capability. Right gate electrode 302 is at the same potential as right main electrode 252a when switch 309 is in the downward position. Right gate electrode 302 is between left gate electrode 301 and the right notch edge drift region portion 311. Since the right gate electrode 302 is at substantially the same potential level as drift region portion 311 along the right side of the notch, drift region portion 311 is shielded from the effects of relatively negative left gate electrode 301 and the electric field gradient thereto. The structure is symmetric, and in the other half cycle of the AC source with left main electrode 250a rising positively relative to right main electrode 252a, left gate electrode 301 is insulated between the relatively negative right gate electrode 302 and the drift region portion 312 along the left edge of the notch and shields the latter from electric field gradient induced depletion. The single drift region around the notch supports OFF state blocking voltage in both directions. Left and right gate electrodes 301 and 302 in the OFF state are close to the potential of their respective source regions 214 and 266.

It is recognized that various modifications and alternatives are possible within the scope of the appended claims.

We claim:

1. A bidirectional FET, comprising in a semiconductor substrate:
a first source region of one conductivity type semiconductor material;
a first channel region of opposite conductivity type semiconductor meterial forming a junction with said first source region;
a single drift region of said one conductivity type semiconductor material forming another junction with said first channel region;
a second channel region of said opposite conductivity type semiconductor material forming a junction with said drift region;
a second source region of said one conductivity type semiconductor material forming a junction with said second channel region;
a notch extending between and separating said first and second regions and said first and second channel regions, and extending into said drift region;
insulated split gate means in said notch comprising a first gate electrode disposed proximate said first channel region and a second separate gate electrode disposed proximate said second channel region, and adapted for application of electrical potential for producing electric fields of sufficient intensity to invert the conductivity type in said first and second channel regions;
said single drift region forming first and second PN junctions with respective said first and second channel regions, said first and second source regions forming third and fourth PN junctions with respective said first and second channel regions;
a first main electrode contacting said first source region and said first channel region;
a second main electrode contacting said second source region and said second channel region;
a source of alternating voltage impressed across said first and second main electrodes such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reverse biased junction;
a first gating voltage source connected to said first gate means in said second half cycle of said alternating voltage to create a first inversion channel region between said single drift region and said first source region to short the otherwise blocking reverse biased said first PN junction during said second half cycle of said alternating voltage such that current flows through said FET from said second main electrode to said first main electrode during said second half cycle of said alternating voltage;
a second gating voltage source connected to said second gate means in said first half cycle of said alternating voltage to create a second inversion channel region between said single drift region and said second source region to short the otherwise blocking reverse biased said second PN junction during said first half cycle of said alternating voltage such that current flows through said FET from said first main electrode to said second main electrode during said first half cycle of said alternating voltage;
said FET having an OFF state in the absence of said gating electrical potential from said first and second gating voltage sources, said single drift region supporting OFF state blocking voltage in both directions, and wherein said first and second gate means are at non-common potentials in said OFF state.

2. The invention according to claim 1 wherein said first and second gate electrodes are laterally spaced left-right and extend generally verttically in said notch, and wherein said right gate electrode is insulated between said left gate electrode and the right edge of said notch for preventing electric field gradient induced depletion in the drift region portion along said right notch edge otherwise due to the electric field gradient from said left gate electrode, whereby to shield said drift region portion along said right notch edge from said left gate electrode and prevent unwanted inducement of conduction channels in said drift region during said OFF state, and wherein said left gate electrode is insultated between said right gate electrode and the left edge of said notch for preventing electric field gradient induced depletion in the drift region portion along said left notch edge whereby to shield said drift region portion along said left notch edge from the electric field gradient from said right gate electrode and prevent unwanted inducement of conduction channels in said drift region during said OFF state.

3. A bidirectional FET comprising:
 a first source region of one conductivity type semiconductor material;
 a first channel region of opposite conductivity type semiconductor material forming a junction with said first source region;
 a single drift region of said one conductivity type semiconductor material forming another junction with said first channel region;
 a second channel region of said opposite conductivity type semiconductor material forming a junction with said drift region;
 a second source region of said one conductivity type semiconductor material forming a junction with said second channel region;
 a notch extending downwardly between and separating said first and second source regions and said first and second channel regions, and extending downwardly into said drift region;
 insulated split gate means in said notch comprising a left gate electrode extending vertically within said notch proximate said first channel region and a right gate electrode extending vertically within said notch proximate said second channel region, said right gate electrode being insulated between said left gate electrode and the right side edge of said notch, and said left gate electrode being insulated between said right gate electrode and the left side edge of said notch, said gate electrodes being adapted for application of electrical potential for producing electric fields of sufficient intensity to invert the conductivity type in said first and second channel regions;
 first and second main electrodes each connected to a respective said source region and channel region;
 whereby upon application of voltage of either polarity to said first and second main electrodes from an AC power source, electric current can flow in a respective corresponding direction between said main electrodes, under control of said electrical potential of said gate electrodes, the conductive current through said drift region traversing along one side of said notch then around the bottom end thereof then along the other side of said notch;
 said FET having an OFF state in the absence of said electrical gate potential, with the junction between said drift region and one of said channel regions blocking current flow toward one of said source regions and in its respective said main electrode, and with the junction between said drift region and the other of said channel regions blocking current flow toward the other of said source regions and its respective said main electrode, said single drift region around said notch supporting OFF state blocking voltage in both directions; and
 means connecting said left gate electrode to said first main electrode in said OFF state for both half cycles of said AC source, and means connecting said right gate electrode to said second main electrode in said OFF state for both half cycles of said AC source,
  such that during the first half cycle of said AC source during said OFF state of said FET, voltage rises positively at said second main electrode relative to said first main electrode, and the potential in said second channel region and said drift region likewise rises positively, the potential in said drift region along said right side of said notch also rising positively, said left gate electrode being negative due to said means connecting said left gate electrode to said first main electrode, said relatively negative left gate electrode establishing an electric field gradient between itself and the relatively positive said drift region across said notch, said electric field gradient causing attraction of carriers in said drift region toward the right edge of said notch below said second channel region due to the attraction from said relatively negative left gate electrode and the electric field gradient thereto, migration of minority carriers into said drift region along said right edge of said notch causing depletion of majority carriers out of said right notch edge drift region portion which in turn may invert the conductivity type of such region if the concentration of minority carriers becomes great enough to form an induced conductive channel around said drift region and in turn cause said FET to lose its OFF state voltage blocking capability, said right gate electrode shielding said right notch edge drift region portion from the electric field gradient from said left gate electrode by being at substantially the same potential as said second main electrode and hence be relatively positively biased, said right gate electrode being between said left gate electrode and said right notch edge drift region portion to shield the latter from the effects of said relatively negative left gate electrode and the electric field gradient thereto whereby to prevent depletion and unwanted inducement of conduction channels in said drift region during said OFF state,
  and such that in the other half cycle of said AC source during said OFF state with said first main electrode rising positively relative to said second main electrode, said left gate electrode is insulated between the relatively negative said right gate electrode and the left notch edge drift region portion and shields the latter from electric field gradient induced depletion.

* * * * *